(12) United States Patent
Li (10) Patent No.: US 11,552,158 B2
(45) Date of Patent: Jan. 10, 2023

(54) LIGHT EMITTING PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Songshan Li, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 694 days.

(21) Appl. No.: 16/343,292

(22) PCT Filed: Mar. 21, 2019

(86) PCT No.: PCT/CN2019/079017
§ 371 (c)(1),
(2) Date: Apr. 18, 2019

(87) PCT Pub. No.: WO2020/124835
PCT Pub. Date: Jun. 25, 2020

(65) Prior Publication Data
US 2021/0328001 A1    Oct. 21, 2021

(30) Foreign Application Priority Data
Dec. 21, 2018   (CN) .......................... 201811574871.9

(51) Int. Cl.
*H01L 27/32*    (2006.01)

(52) U.S. Cl.
CPC ...... *H01L 27/3279* (2013.01); *H01L 27/3246* (2013.01)

(58) Field of Classification Search
CPC ....................................................... H01L 27/12
See application file for complete search history.

(56) References Cited

U.S. PATENT DOCUMENTS

| 10,665,617 B2 * | 5/2020 | Cho ..................... G09G 3/3266 |
| 2017/0069701 A1 | 3/2017 | Cai |

(Continued)

FOREIGN PATENT DOCUMENTS

| CN | 104795403 A | 7/2015 |
| CN | 107845643 A | 3/2018 |

(Continued)

*Primary Examiner* — Fernando L Toledo
*Assistant Examiner* — Valerie N Newton
(74) *Attorney, Agent, or Firm* — PV IP PC; Wei Te Chung; Ude Lu (57) ABSTRACT

Disclosed is a light emitting panel and a display device. The light emitting panel includes a substrate, wherein the substrate comprises a display area, a non-display area and a bending area connecting the display area and the non-display area; a transistor layer, wherein the transistor layer is disposed on the substrate and disposed relative to the display area and the non-display area; an organic layer, wherein the organic layer is disposed on the substrate and disposed relative to the bending area; and a wiring layer, wherein the wiring layer is disposed on the organic layer; wherein a vertical height of the organic layer is greater than a vertical height of the transistor layer.

15 Claims, 3 Drawing Sheets

(56) References Cited

U.S. PATENT DOCUMENTS

| | | | |
|---|---|---|---|
| 2018/0033830 A1* | 2/2018 | Kim | G06F 3/0446 |
| 2019/0148474 A1 | 5/2019 | Bu | |
| 2019/0164995 A1* | 5/2019 | Lee | H01L 27/3276 |

FOREIGN PATENT DOCUMENTS

| | | | |
|---|---|---|---|
| CN | 107994055 A | 5/2018 |
| CN | 108550612 A | 9/2018 |
| CN | 108962948 A | 12/2018 |

\* cited by examiner

LIGHT EMITTING PANEL AND DISPLAY DEVICE

FIELD OF THE INVENTION

The present application relates to a display field, and more particularly to a light emitting panel and a display device.

BACKGROUND OF THE INVENTION

In recent years, the organic light emitting diode (OLED) possesses many excellent characteristics, such as self-illumination, low energy consumption, wide viewing angle, rich color, fast response and flexible screen preparation, and thus causes great interest in the field of scientific research and industry, and is considered to be a promising next-generation display technology.

In the fabrication process of a thin film transistor (TFT) backplane of a conventional low temperature poly-silicon organic light emitting diode (LTPS-OLED) of the prior art, for enhancing the bendability of the light emitting panel, a deep hole (DH) is etched in the Pad bending zone, and then an organic dry hole material (ODH) is filled in the DH; however, as the bending is performed, the wiring layer on the ODH will be broken, which seriously affects the yield of the light emitting panel.

Therefore, the prior art possesses drawbacks and is in urgent need of improvement.

SUMMARY OF THE INVENTION

The embodiment of the present application provides a light emitting panel and a display device, which can reduce the occurrence of breakage of the wiring layer and improve the yield of the light emitting panel.

First, the embodiment of the present application provides a light emitting panel, including:

a substrate, wherein the substrate comprises a display area, a non-display area and a bending area connecting the display area and the non-display area;

a transistor layer, wherein the transistor layer is disposed on the substrate and disposed relative to the display area and the non-display area;

an organic layer, wherein the organic layer is disposed on the substrate and disposed relative to the bending area; and a wiring layer, wherein the wiring layer is disposed on the organic layer;

wherein a vertical height of the organic layer is greater than a vertical height of the transistor layer.

In the light emitting panel of the present application, the organic layer includes a first extending portion and a second extending portion, and an extending direction of the first extending portion is horizontally extended, and an extending direction of the second extending portion is vertically extended.

In the light emitting panel of the present application, a horizontal width of the first extending portion is greater than a horizontal width of the second extending portion such that the first extending portion and the second extending portion form a resisting structure.

In the light emitting panel of the present application, the resisting structure and the transistor layer are against each other.

In the light emitting panel of the present application, the vertical height of the organic layer is 0.3 to 0.7 micrometers.

In the light emitting panel of the present application, the light emitting panel further includes a thin film transistor, wherein the thin film transistor is disposed in the transistor layer;

wherein the transistor layer further includes a barrier layer, a buffer layer, a first gate insulating layer, a second gate insulating layer and an interlayer dielectric layer which are sequentially stacked from bottom to top; one end of the thin film transistor is connected to the buffer layer, and an other end of the thin film transistor sequentially penetrates the first gate insulating layer, the second gate insulating layer and the interlayer dielectric layer.

In the light emitting panel of the present application, a first gate is disposed on the second gate insulating layer, and a second gate is disposed on the interlayer dielectric layer.

In the light emitting panel of the present application, a planar organic layer and a pixel defining layer are further disposed on the transistor layer, and the pixel defining layer covers the planar organic layer.

In the light emitting panel of the present application, the substrate is made of a flexible material, and a pixel area is disposed in the substrate.

Second, the embodiment of the present application further provides a display device, including a housing and a light emitting panel, wherein the light emitting panel is disposed on the housing, and the light emitting panel comprises:

a substrate, wherein the substrate comprises a display area, a non-display area and a bending area connecting the display area and the non-display area;

a transistor layer, wherein the transistor layer is disposed on the substrate and disposed relative to the display area and the non-display area;

an organic layer, wherein the organic layer is disposed on the substrate and disposed relative to the bending area; and a wiring layer, wherein the wiring layer is disposed on the organic layer;

wherein a vertical height of the organic layer is greater than a vertical height of the transistor layer.

In the display device of the present application, the organic layer includes a first extending portion and a second extending portion, and an extending direction of the first extending portion is horizontally extended, and an extending direction of the second extending portion is vertically extended.

In the display device of the present application, a horizontal width of the first extending portion is greater than a horizontal width of the second extending portion such that the first extending portion and the second extending portion form a resisting structure.

In the display device of the present application, the resisting structure and the transistor layer are against each other.

In the display device of the present application, the vertical height of the organic layer is 0.3 to 0.7 micrometers.

In the display device of the present application, the light emitting panel further includes a thin film transistor, wherein the thin film transistor is disposed in the transistor layer;

wherein the transistor layer further includes a barrier layer, a buffer layer, a first gate insulating layer, a second gate insulating layer and an interlayer dielectric layer which are sequentially stacked from bottom to top; one end of the thin film transistor is connected to the buffer layer, and an other end of the thin film transistor sequentially penetrates the first gate insulating layer, the second gate insulating layer and the interlayer dielectric layer.

In the display device of the present application, a first gate is disposed on the second gate insulating layer, and a second gate is disposed on the interlayer dielectric layer.

In the display device of the present application, a planar organic layer and a pixel defining layer are further disposed on the transistor layer, and the pixel defining layer covers the planar organic layer.

In the display device of the present application, the substrate is made of a flexible material, and a pixel area is disposed in the substrate.

Third, the embodiment of the present application further provides a light emitting panel, including:

a substrate, wherein the substrate comprises a display area, a non-display area and a bending area connecting the display area and the non-display area;

a transistor layer, wherein the transistor layer is disposed on the substrate and disposed relative to the display area and the non-display area;

an organic layer, wherein the organic layer is disposed on the substrate and disposed relative to the bending area; and a wiring layer, wherein the wiring layer is disposed on the organic layer; wherein a vertical height of the organic layer is greater than a vertical height of the transistor layer, wherein a planar organic layer and a pixel defining layer are further disposed on the transistor layer, and the pixel defining layer covers the planar organic layer, and the pixel defining layer covers the planar organic layer, and the substrate is made of a flexible material, and a pixel area is disposed in the substrate.

The light emitting panel provided by the embodiment of the present application includes a substrate, wherein the substrate comprises a display area, a non-display area and a bending area connecting the display area and the non-display area; a transistor layer, wherein the transistor layer is disposed on the substrate and disposed relative to the display area and the non-display area; an organic layer, wherein the organic layer is disposed on the substrate and disposed relative to the bending area; and a wiring layer, wherein the wiring layer is disposed on the organic layer; wherein a vertical height of the organic layer is greater than a vertical height of the transistor layer. Thereby, the occurrence of breakage of the wiring layer is reduced, and the yield of the light emitting panel is improved.

BRIEF DESCRIPTION OF THE DRAWINGS

In order to more clearly illustrate the embodiments of the present application, the following figures will be described in the embodiments are briefly introduced. It is obvious that the drawings are only some embodiments of the present application, those of ordinary skill in this field can obtain other figures according to these figures without paying the premise.

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are merely part of embodiments of the present invention, but not all embodiments. Based on the embodiments of the present invention, all other embodiments to those of skilled in the premise of no creative efforts obtained, should be considered within the scope of protection of the present invention.

In the fabrication process of a thin film transistor (TFT) backplane of a conventional low temperature poly-silicon organic light emitting diode (LTPS-OLED) of the prior art, for enhancing the bendability of the light emitting panel, a deep hole (DH) is etched in the Pad bending zone, and then an organic dry hole material (ODH) is filled in the DH, and a thickness of the ODH is about 1.5 micrometers (μm); however, as the bending is performed, since the stress neutral plane is not on the wiring layer of the pad bending area, the stress release is uneven as bending, and thus the wiring layer on the ODH will be broken, which seriously affects the yield of the light emitting panel.

The embodiment of the present application provides a display device, including a housing and a light emitting panel, wherein the light emitting panel is disposed on the housing, and the light emitting panel comprises:

a substrate, wherein the substrate comprises a display area, a non-display area and a bending area connecting the display area and the non-display area;

a transistor layer, wherein the transistor layer is disposed on the substrate and disposed relative to the display area and the non-display area;

an organic layer, wherein the organic layer is disposed on the substrate and disposed relative to the bending area; and a wiring layer, wherein the wiring layer is disposed on the organic layer;

wherein a vertical height of the organic layer is greater than a vertical height of the transistor layer.

The organic layer includes a first extending portion and a second extending portion, and an extending direction of the first extending portion is horizontally extended, and an extending direction of the second extending portion is vertically extended.

A horizontal width of the first extending portion is greater than a horizontal width of the second extending portion such that the first extending portion and the second extending portion form a resisting structure.

The resisting structure and the transistor layer are against each other.

The vertical height of the organic layer is 0.3 to 0.7 micrometers.

The light emitting panel further includes a thin film transistor, wherein the thin film transistor is disposed in the transistor layer;

wherein the transistor layer further includes a barrier layer, a buffer layer, a first gate insulating layer, a second gate insulating layer and an interlayer dielectric layer which are sequentially stacked from bottom to top; one end of the thin film transistor is connected to the buffer layer, and an other end of the thin film transistor sequentially penetrates the first gate insulating layer, the second gate insulating layer and the interlayer dielectric layer.

A first gate is disposed on the second gate insulating layer, and a second gate is disposed on the interlayer dielectric layer.

A planar organic layer and a pixel defining layer are further disposed on the transistor layer, and the pixel defining layer covers the planar organic layer.

The substrate is made of a flexible material, and a pixel area is disposed in the substrate.

Figure 1:
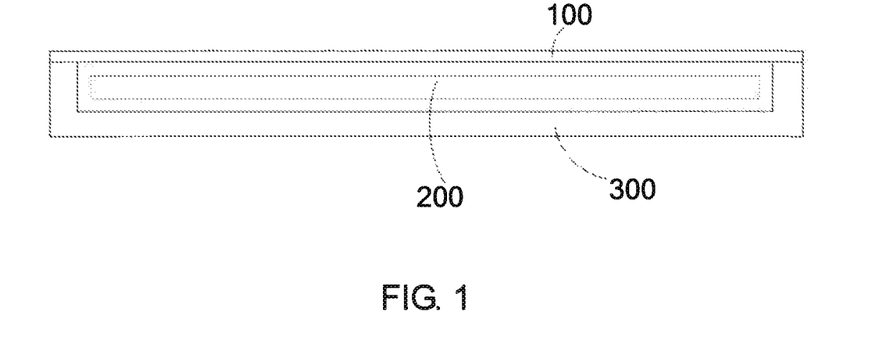
FIG. 1 is a structural diagram of a display device according to an embodiment of the present application.

Please refer to FIG. 1. FIG. 1 is a structural diagram of a display device 1000 according to an embodiment of the present application. The display device 100 may include a light emitting panel 100, a control circuit 200 and a housing 300. Specifically, the display device 1000 shown in FIG. 1 is not limited to include the foregoing components, and may further include other components, such as a camera, an antenna structure and a fingerprint unlocking module.

The light emitting panel 100 is disposed on the housing 300.

In some embodiments, the light emitting panel 100 may be fixed to the housing 300, and the light emitting panel 100 and the housing 300 form a sealed space to accommodate devices such as the control circuit 200.

In some embodiments, the housing 300 can be made of a flexible material, such as a plastic housing or a silicone housing.

The control circuit 200 is mounted in the housing 300, and the control circuit 200 can be a main board of the display device 1000. The control circuit 200 can integrate one, two or more of a battery, an antenna structure, a microphone, a speaker, a headphone interface, a universal serial bus interface, a camera, a distance sensor, an ambient light sensor, a receiver and a processor.

The light emitting panel 100 is mounted with the housing 300, and meanwhile, the light emitting panel 100 is electrically connected to the control circuit 200 to form a display surface of the display device 1000. The light emitting panel 100 may include a display area and a non-display area. The display area can be used to show a screen of the display device 1000 or can be used for touch manipulation for a user. This non-display area can be used to set various functional components.

Figure 2:
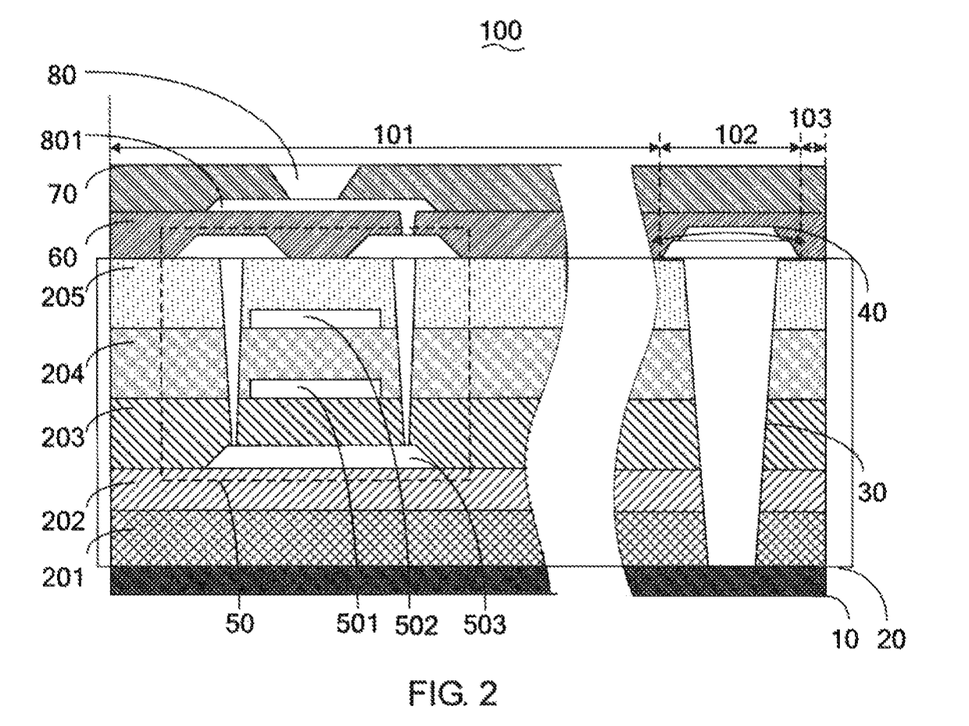
FIG. 2 is a structural diagram of a light emitting panel according to an embodiment of the present application.

Referring to FIG. 2, FIG. 2 is a structural diagram of a light emitting panel according to an embodiment of the present disclosure. The light emitting panel 100 includes:

a substrate 10, wherein the substrate 10 comprises a display area 101, a non-display area 102 and a bending area 103 connecting the display area 101 and the non-display area 102;

a transistor layer 20, wherein the transistor layer 20 is disposed on the substrate 10 and disposed relative to the display area 101 and the non-display area 102;

an organic layer 30, wherein the organic layer 30 is disposed on the substrate 10 and disposed relative to the bending area 103; and a wiring layer 40, wherein the wiring layer 40 is disposed on the organic layer 30; wherein a vertical height of the organic layer 30 is greater than a vertical height of the transistor layer 20.

It can be understood that the substrate 10 includes the display area 101, the non-display area 102 and the bending area 103. When the light emitting panel 100 is bent, the non-display area 102 is bent to the back side of the display area 101 with the bending area 103. When the light emitting panel 100 is bent, the stress is generated. However, since the stress is not generated on the wiring layer 40 on the organic layer 30, the stress generated by the bending is released unevenly, thereby damaging the wiring layer 40.

In the prior art, the vertical height of the organic layer 30 is equal to the vertical height of the transistor layer 20. As bending the light emitting panel 100, the stress neutral plane generated by the stress will be located above the wiring layer 40. Therefore, by making the vertical height of the organic layer 30 greater than the vertical height of the transistor layer 20, the stress neutral plane will be located above or below the wiring layer 40. Preferably, the stress neutral plane is located on the wiring layer 40, such that the stress can be evenly released.

The light emitting panel 100 provided by the embodiment of the present application includes a substrate 10, wherein the substrate 10 comprises a display area 101, a non-display area 102 and a bending area 103 connecting the display area 101 and the non-display area 102; a transistor layer 20, wherein the transistor layer 20 is disposed on the substrate 10 and disposed relative to the display area 101 and the non-display area 102; an organic layer 30, wherein the organic layer 30 is disposed on the substrate 10 and disposed relative to the bending area 103; and a wiring layer 40, wherein the wiring layer 40 is disposed on the organic layer 30; wherein a vertical height of the organic layer 30 is greater than a vertical height of the transistor layer 20. Thereby, the occurrence of breakage of the wiring layer 40 is reduced, and the yield of the light emitting panel 100 is improved.

In some embodiments, the light emitting panel 100 further includes a thin film transistor 50, wherein the thin film transistor 50 is disposed in the transistor layer 20;

wherein the transistor layer 20 further includes a barrier layer 201, a buffer layer 202, a first gate insulating layer 203, a second gate insulating layer 204 and an interlayer dielectric layer 205 which are sequentially stacked from bottom to top; one end of the thin film transistor 50 is connected to the buffer layer 202, and the other end of the thin film transistor 50 sequentially penetrates the first gate insulating layer 203, the second gate insulating layer 204 and the interlayer dielectric layer 205, and the organic layer is composed of an organic photoresist material.

The barrier layer 201 may be made of a material such as silicon dioxide, and the buffer layer may be composed of a material containing silicon, nitrogen and oxygen.

The first gate insulating layer 203 is provided with polysilicon for connecting with the source and the drain to form a conductive channel.

In some embodiments, a first gate 501 is disposed on the second gate insulating layer 204, and a second gate 502 is disposed on the interlayer dielectric layer 205.

In some embodiments, a planar organic layer 60 and a pixel defining layer 70 are further disposed on the transistor layer 20, and the pixel defining layer 70 covers the planar organic layer 60.

An organic light emitting diode (OLED) device 80 is further disposed in the pixel defining layer 70 and the OLED device 80 includes:

an anode 801, a hole transport layer, a light emitting layer, an electron transport layer and a cathode (neither shown in the drawing). When the power supply reaches an appropriate voltage, the anode holes and the cathode electrons are combined in the light emitting layer to generate light, thereby producing red, green and blue (RGB) three primary colors. The anode 801 is connected to the source or the drain of the thin film transistor 50.

A semiconductor layer 503 is further disposed on the first gate insulating layer 203.

In some embodiments, the substrate 10 is made of a flexible material, and a pixel area is disposed in the substrate 10.

The substrate 10 may be made of a polymer material such as polyimide (PI), and the pixel area includes, but is not limited to, R pixel, G pixel, and B pixel.

Figure 3:
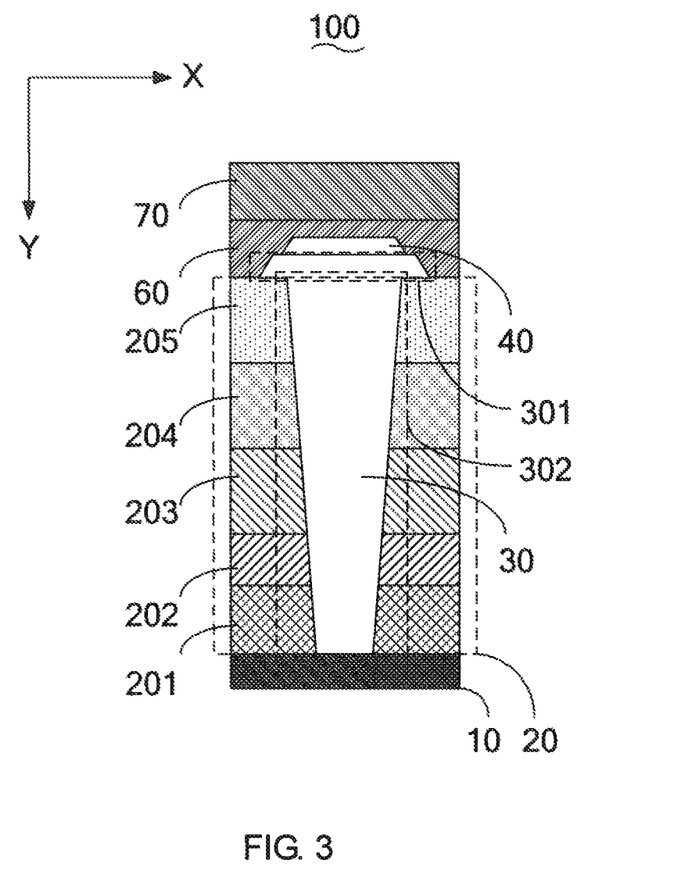
FIG. 3 is a partial enlarged view diagram of a light emitting panel according to an embodiment of the present application.

Specifically, referring to FIG. 3, FIG. 3 is a partial enlarged view diagram of a light emitting panel according to an embodiment of the present application.

The organic layer 30 includes a first extending portion 301 and a second extending portion 302, and an extending direction of the first extending portion 301 is horizontally extended, and an extending direction of the second extending portion 302 is vertically extended.

It can be understood that organic layer 30 includes two portions. The first portion is the first extending portion 301. The first extending portion 301 may extend in the X direction or the X negative direction. The second portion is the second extending portion 302. The second extending portion 302 may extend in the Y direction or the Y negative direction.

The vertical height of the second extending portion 302 (that is, the height in the Y direction) is 1.5 μm or more.

In some embodiments, a horizontal width of the first extending portion 301 is greater than a horizontal width of the second extending portion 302 such that the first extending portion 301 and the second extending portion 302 form a resisting structure.

In some embodiments, the resisting structure and the transistor layer 20 are against each other.

Since the horizontal width (i.e. the width in the X direction) of the first extending portion 301 is greater than the horizontal width of the second extending portion 302. Thus, when the first extending portion 301 is in contact with the second extending portion 302, a corner is generated, and the corner is the resisting structure.

In some embodiments, the vertical height of the organic layer is 0.3 to 0.7 micrometers (μm).

The light emitting panel 100 provided by the embodiment of the present application includes a substrate 10, wherein the substrate 10 comprises a display area 101, a non-display area 102 and a bending area 103 connecting the display area 101 and the non-display area 102; a transistor layer 20, wherein the transistor layer 20 is disposed on the substrate 10 and disposed relative to the display area 101 and the non-display area 102; an organic layer 30, wherein the organic layer 30 is disposed on the substrate 10 and disposed relative to the bending area 103; and a wiring layer 40, wherein the wiring layer 40 is disposed on the organic layer 30; wherein a vertical height of the organic layer 30 is greater than a vertical height of the transistor layer 20. Thereby, the occurrence of breakage of the wiring layer 40 is reduced, and the yield of the light emitting panel 100 is improved.

Figure 4:
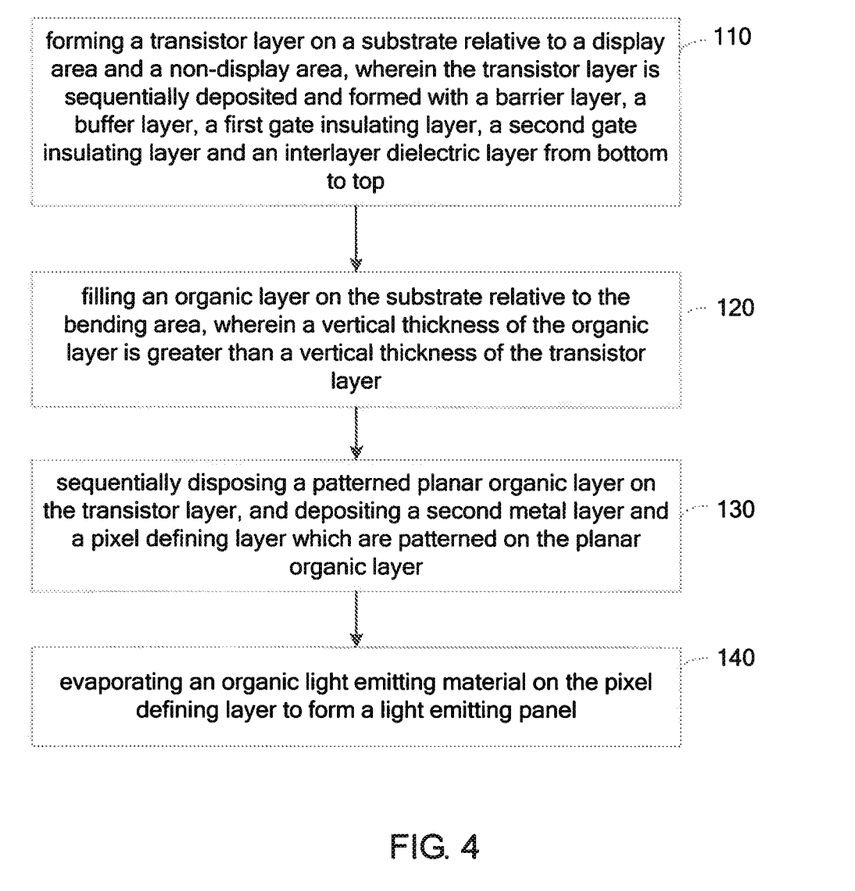
FIG. 4 is a flow chart of a manufacturing method of a light emitting panel according to an embodiment of the present application.

As shown in FIG. 4, FIG. 4 is a flow chart of a manufacturing method of a light emitting panel according to an embodiment of the present application. The manufacturing method of the light emitting panel is used for manufacturing the light emitting panel as described above. The manufacturing method of the light emitting panel includes:

Step 110, forming a transistor layer on a substrate relative to a display area and a non-display area, wherein the transistor layer is sequentially deposited and formed with a barrier layer, a buffer layer, a first gate insulating layer, a second gate insulating layer and an interlayer dielectric layer from bottom to top;

wherein a patterned semiconductor layer is disposed on the first gate insulating layer, and a patterned first gate is disposed on the second gate insulating layer, and a patterned second gate is disposed on the interlayer dielectric layer.

Step 120, filling an organic layer on the substrate relative to the bending area, wherein a vertical thickness of the organic layer is greater than a vertical thickness of the transistor layer;

wherein a first metal layer is further deposited on the organic layer, and the first metal layer is patterned to obtain a wiring layer. The first metal layer includes a titanium/aluminum/titanium metal layer.

Step 130, sequentially disposing a patterned planar organic layer on the transistor layer, and depositing a second metal layer and a pixel defining layer which are patterned on the planar organic layer.

The second metal layer is a titanium oxide/silver/titanium oxide metal layer, and the planar organic layer and the pixel defining layer are generally made of polyimide (PI).

Step 140, evaporating an organic light emitting material on the pixel defining layer to form a light emitting panel.

The embodiment of the present application further provides a light emitting panel, including:

a substrate, wherein the substrate comprises a display area, a non-display area and a bending area connecting the display area and the non-display area;

a transistor layer, wherein the transistor layer is disposed on the substrate and disposed relative to the display area and the non-display area;

an organic layer, wherein the organic layer is disposed on the substrate and disposed relative to the bending area; and a wiring layer, wherein the wiring layer is disposed on the organic layer; wherein a vertical height of the organic layer is greater than a vertical height of the transistor layer, wherein a planar organic layer and a pixel defining layer are further disposed on the transistor layer, and the pixel defining layer covers the planar organic layer, and the pixel defining layer covers the planar organic layer, and the substrate is made of a flexible material, and a pixel area is disposed in the substrate.

In the foregoing embodiments, the description of the various embodiments have respective different emphases, and a part in some embodiment, which is not described in detail can be referred to the related description of other embodiments.

The light emitting panel, the manufacturing method of the light emitting panel and the display device provided by the embodiments of the present application are described in detail as aforementioned, and the principles and implementations of the present application have been described with reference to specific illustrations. The description of the foregoing embodiments is merely for helping to understand the technical solutions of the present application and the core ideas thereof; those skilled in the art should understand that the technical solutions described in the foregoing embodiments may be modified, or some of the technical features may be equivalently replaced; and the modifications or replacements do not deviate from the spirit and scope of the technical solutions of the embodiments of the present application.

What is claimed is:

1. A light emitting panel, including:
   a substrate, wherein the substrate comprises a display area, a non-display area and a bending area connecting the display area and the non-display area;
   a transistor layer, wherein the transistor layer is disposed on the substrate and disposed relative to the display area and the non-display area;
   an organic layer, wherein the organic layer is disposed on the substrate and disposed relative to the bending area; and a wiring layer, wherein the wiring layer is disposed on a top surface of the organic layer, and an area of the wiring layer is less than an area of the top surface of the organic layer; wherein a vertical height of the organic layer is greater than a vertical height of the transistor layer;

the organic layer includes a first extending portion and a second extending portion, and an extending direction of the first extending portion is horizontally extended, and an extending direction of the second extending portion is vertically extended;

a horizontal width of the first extending portion is greater than a horizontal width of the second extending portion such that the first extending portion and the second extending portion form a resisting structure; and the horizontal width of the first extending portion is less than a horizontal width of the transistor layer.

2. The light emitting panel according to claim 1, wherein the resisting structure and the transistor layer are against each other.

3. The light emitting panel according to claim 1, wherein the vertical height of the organic layer is 0.3 to 0.7 micrometers.

4. The light emitting panel according to claim 1, further including a thin film transistor, wherein the thin film transistor is disposed in the transistor layer;

wherein the transistor layer further includes a barrier layer, a buffer layer, a first gate insulating layer, a second gate insulating layer and an interlayer dielectric layer which are sequentially stacked from bottom to top; one end of the thin film transistor is connected to the buffer layer, and an other end of the thin film transistor sequentially penetrates the first gate insulating layer, the second gate insulating layer and the interlayer dielectric layer.

5. The light emitting panel according to claim 4, wherein a first gate is disposed on the second gate insulating layer, and a second gate is disposed on the interlayer dielectric layer.

6. The light emitting panel according to claim 1, wherein a planar organic layer and a pixel defining layer are further disposed on the transistor layer, and the pixel defining layer covers the planar organic layer.

7. The light emitting panel according to claim 1, wherein the substrate is made of a flexible material, and a pixel area is disposed in the substrate.

8. A display device, including a housing and a light emitting panel, wherein the light emitting panel is disposed on the housing, and the light emitting panel comprises:

a substrate, wherein the substrate comprises a display area, a non-display area and a bending area connecting the display area and the non-display area;

a transistor layer, wherein the transistor layer is disposed on the substrate and disposed relative to the display area and the non-display area;

an organic layer, wherein the organic layer is disposed on the substrate and disposed relative to the bending area; and a wiring layer, wherein the wiring layer is disposed on a top surface of the organic layer, and an area of the wiring layer is less than an area of the top surface of the organic layer; wherein a vertical height of the organic layer is greater than a vertical height of the transistor layer;

the organic layer includes a first extending portion and a second extending portion, and an extending direction of the first extending portion is horizontally extended, and an extending direction of the second extending portion is vertically extended;

a horizontal width of the first extending portion is greater than a horizontal width of the second extending portion such that the first extending portion and the second extending portion form a resisting structure; and the horizontal width of the first extending portion is less than a horizontal width of the transistor layer.

9. The display device according to claim 8, wherein the resisting structure and the transistor layer are against each other.

10. The display device according to claim 8, wherein the vertical height of the organic layer is 0.3 to 0.7 micrometers.

11. The display device according to claim 8, further including a thin film transistor, wherein the thin film transistor is disposed in the transistor layer;

wherein the transistor layer further includes a barrier layer, a buffer layer, a first gate insulating layer, a second gate insulating layer and an interlayer dielectric layer which are sequentially stacked from bottom to top; one end of the thin film transistor is connected to the buffer layer, and an other end of the thin film transistor sequentially penetrates the first gate insulating layer, the second gate insulating layer and the interlayer dielectric layer.

12. The display device according to claim 11, wherein a first gate is disposed on the second gate insulating layer, and a second gate is disposed on the interlayer dielectric layer.

13. The display device according to claim 8, wherein a planar organic layer and a pixel defining layer are further disposed on the transistor layer, and the pixel defining layer covers the planar organic layer.

14. The display device according to claim 8, wherein the substrate is made of a flexible material, and a pixel area is disposed in the substrate.

15. A light emitting panel, including:

a substrate, wherein the substrate comprises a display area, a non-display area and a bending area connecting the display area and the non-display area;

a transistor layer, wherein the transistor layer is disposed on the substrate and disposed relative to the display area and the non-display area;

an organic layer, wherein the organic layer is disposed on the substrate and disposed relative to the bending area; and a wiring layer, wherein the wiring layer is only disposed on a top surface of the organic layer, and an area of the wiring layer is less than an area of the top surface of the organic layer; wherein a vertical height of the organic layer is greater than a vertical height of the transistor layer, wherein a planar organic layer and a pixel defining layer are further disposed on the transistor layer, and the pixel defining layer covers the planar organic layer, and the substrate is made of a flexible material, and a pixel area is disposed in the substrate;

the organic layer includes a first extending portion and a second extending portion, and an extending direction of the first extending portion is horizontally extended, and an extending direction of the second extending portion is vertically extended;

a horizontal width of the first extending portion is greater than a horizontal width of the second extending portion such that the first extending portion and the second extending portion form a resisting structure; and the horizontal width of the first extending portion is less than a horizontal width of the transistor layer.

\* \* \* \* \*